(12) United States Patent
Mimotogi et al.

(10) Patent No.: US 8,883,373 B2
(45) Date of Patent: Nov. 11, 2014

(54) METHOD FOR MANUFACTURING PHOTO MASK, METHOD FOR MANUFACTURING SEMICONDUCTOR DEVICE, AND PROGRAM

(71) Applicants: Akiko Mimotogi, Yokohama (JP); Suigen Kyoh, Nagoya (JP); Tetsuro Nakasugi, Yokohama (JP)

(72) Inventors: Akiko Mimotogi, Yokohama (JP); Suigen Kyoh, Nagoya (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/679,396

(22) Filed: Nov. 16, 2012

(65) Prior Publication Data

US 2013/0130157 A1    May 23, 2013

(30) Foreign Application Priority Data

Nov. 17, 2011 (JP) ................................. 2011-251451

(51) Int. Cl.
*G03F 1/62* (2012.01)
*G03F 1/64* (2012.01)

(52) U.S. Cl.
CPC ....................................... *G03F 1/62* (2013.01)
USPC .......................................................... 430/5

(58) Field of Classification Search
CPC .... G03F 1/62; G03F 1/64; G01N 2021/95676
USPC .................................................. 430/5; 428/14
See application file for complete search history.

(56) References Cited

U.S. PATENT DOCUMENTS

| | | | |
|---|---|---|---|
| 6,834,549 B2 * | 12/2004 | Shu et al. ......................... | 73/768 |
| 7,843,552 B2 | 11/2010 | Bruls et al. | |
| 2011/0225554 A1 * | 9/2011 | Laske et al. ..................... | 716/52 |

FOREIGN PATENT DOCUMENTS

| | | |
|---|---|---|
| JP | 2003-50458 | 2/2003 |
| JP | 2004-46259 | 2/2004 |
| JP | 2005-316021 | 11/2005 |
| JP | 4027085 | 10/2007 |
| JP | 2008-182270 | 8/2008 |
| JP | 4491382 | 4/2010 |
| JP | 2010-102356 | 5/2010 |
| WO | WO 2008/105531 A1 | 9/2008 |

* cited by examiner

*Primary Examiner* — Stephen Rosasco
(74) *Attorney, Agent, or Firm* — Finnegan, Henderson, Farabow, Garrett & Dunner, LLP

(57) ABSTRACT

According to one embodiment, a method for manufacturing a photo mask, includes acquiring first data on respective shapes of a plurality of mask substrates, acquiring second data on respective shapes of a plurality of pellicles, and determining a combination of the mask substrate and the pellicle based on the first data and the second data.

12 Claims, 3 Drawing Sheets

METHOD FOR MANUFACTURING PHOTO MASK, METHOD FOR MANUFACTURING SEMICONDUCTOR DEVICE, AND PROGRAM

CROSS-REFERENCE TO RELATED APPLICATIONS

This application is based upon and claims the benefit of priority from Japanese Patent Application No. 2011-251451, filed Nov. 17, 2011, the entire contents of which are incorporated herein by reference.

FIELD

Embodiments described herein relate generally to a method for manufacturing a photo mask, a method for manufacturing a semiconductor device, and a program.

BACKGROUND

In a process of manufacturing a semiconductor device, photolithography is an important step. During photolithography, a foreign substance deposited on a photo mask precludes a pattern from being accurately transferred. Thus, a pellicle is applied to the photo mask to protect a pattern surface of the photo mask. The pellicle lies at a given distance from the pattern surface of the photo mask. Hence, even if a foreign substance is attached to a surface of the pellicle, an image of the foreign substance is prevented from being transferred during exposure.

However, as the semiconductor device size is reduced, distortion of the photo mask after the application of the pellicle poses a problem. For example, the distorted pellicle may distort the photo mask. Furthermore, the photo mask itself may be distorted. Moreover, the photo mask may be distorted after the photo mask is fixed to a photo mask chuck of an exposure apparatus.

When exposure is carried out using the thus distorted photo mask, accurate transfer of the patterns is difficult. Therefore, there has been a demand for a method for enabling accurate pattern transfer.

DETAILED DESCRIPTION

In general, according to one embodiment, a method for manufacturing a photo mask, includes acquiring first data on respective shapes of a plurality of mask substrates; acquiring second data on respective shapes of a plurality of pellicles; and determining a combination of the mask substrate and the pellicle based on the first data and the second data.

An embodiment will be described below with reference to the drawings.

Figure 1:
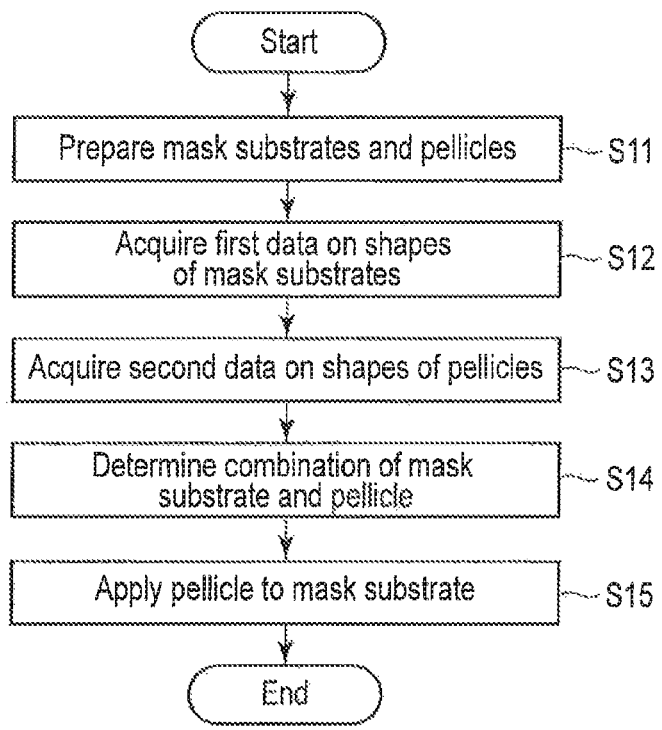
FIG. 1 is a flowchart showing a method for manufacturing a photo mask according to an embodiment.

FIG. 1 is a flowchart showing a method for manufacturing a photo mask according to an embodiment.

First, a plurality of mask substrates and a plurality of pellicles are prepared (S11). Reticles are used as the mask substrates. The mask substrate as used herein may refer to a substrate main body with no pattern (circuit pattern) formed thereon (for example, a mask blank) or a substrate main body with a pattern (circuit pattern) formed thereon for example, a photo mask). Furthermore, as described below, the pellicle comprises a pellicle frame and a pellicle film.

Figure 2:
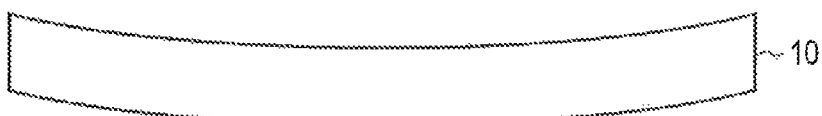
FIG. 2 is a cross-sectional view schematically showing a mask substrate.

Then, first data on the respective shapes of the plurality of mask substrates is acquired (S12), FIG. 2 is a diagram schematically showing a mask substrate 10. The mask substrate 10 is preferably completely flat but is normally distorted as shown in FIG. 2. Thus, the respective shapes of the plurality of mask substrates 10 are measured. Specifically, the flatness of the mask substrates 10, that is, the distribution of distortions, is measured. The results of the measurement are digitized and stored in a storage device (not shown in the drawings).

Figure 3:
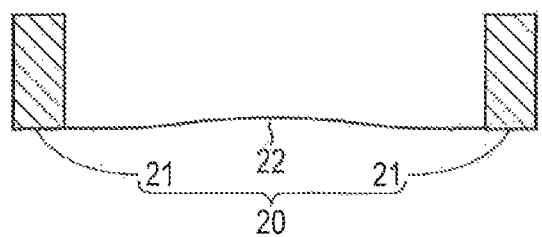
FIG. 3 is a cross-sectional view schematically showing a pellicle.

Then, second data on the respective shapes of the plurality of pellicles is acquired (S13). Specifically, data is acquired which relates to at least either the respective shapes of the plurality of pellicle frames or the shapes of the pellicle films applied to the respective plurality of pellicle frames. As shown in FIG. 3, a pellicle 20 (a pellicle frame 21 and a pellicle film 22) is also normally distorted. Thus, the respective shapes of a plurality of pellicles 20 are measured. Specifically, the flatness of each of the pellicles 20 (the flatness of at least one of the pellicle frame 21 and the pellicle film 22), that is, the distribution of distortions, is measured. The results of the measurement are digitized and stored in the storage device (not shown in the drawings).

Then, based on the first data acquired in step S12 and the second data acquired in step S13, a combination of the mask substrate 10 and the pellicle 20 is determined (S14). This step will be described below.

As described above, the mask substrate 10 is normally distorted. In this case, the distortion of the mask substrate 10 may be reduced by applying the pellicle 20 to the mask substrate 10. Furthermore, even if the mask substrate 10 is almost undistorted, the mask substrate 10 may be distorted by applying the pellicle 20 to the mask substrate 10. Even in this case, the distortion of the mask substrate 10 resulting from the application of the pellicle 20 to the mask substrate 10 is preferably minimized. The appropriate selection of a combination of the mask substrate 10 and the pellicle 20 enables a reduction in the distortion of the mask substrate 10 with the pellicle 20 applied thereto, owing to the stress of the pellicle 20. On the other hand, normally, a plurality of the mask substrates 10 and a plurality of the pellicles 20 are prepared for one lithography process.

Thus, according to the present embodiment, the appropriate combinations of the plurality of mask substrates 10 and the plurality of pellicles 20 are determined based on the first data acquired in step S12 and the second data acquired in step S13. Specifically, the combination is determined such that if the determined pellicle frame is applied to the determined mask substrate, the flatness of the determined mask substrate is smaller than a specified value. The stress of the pellicle frame 21 normally affects the mask substrate 10 more significantly than the stress of the pellicle film 22. Thus, the data on the shape of the pellicle frame 21, that is, the flatness of the pellicle frame 21 (the distribution of distortions of the pellicle frame 21), may be exclusively used as the second data acquired in step S13.

Figure 4:
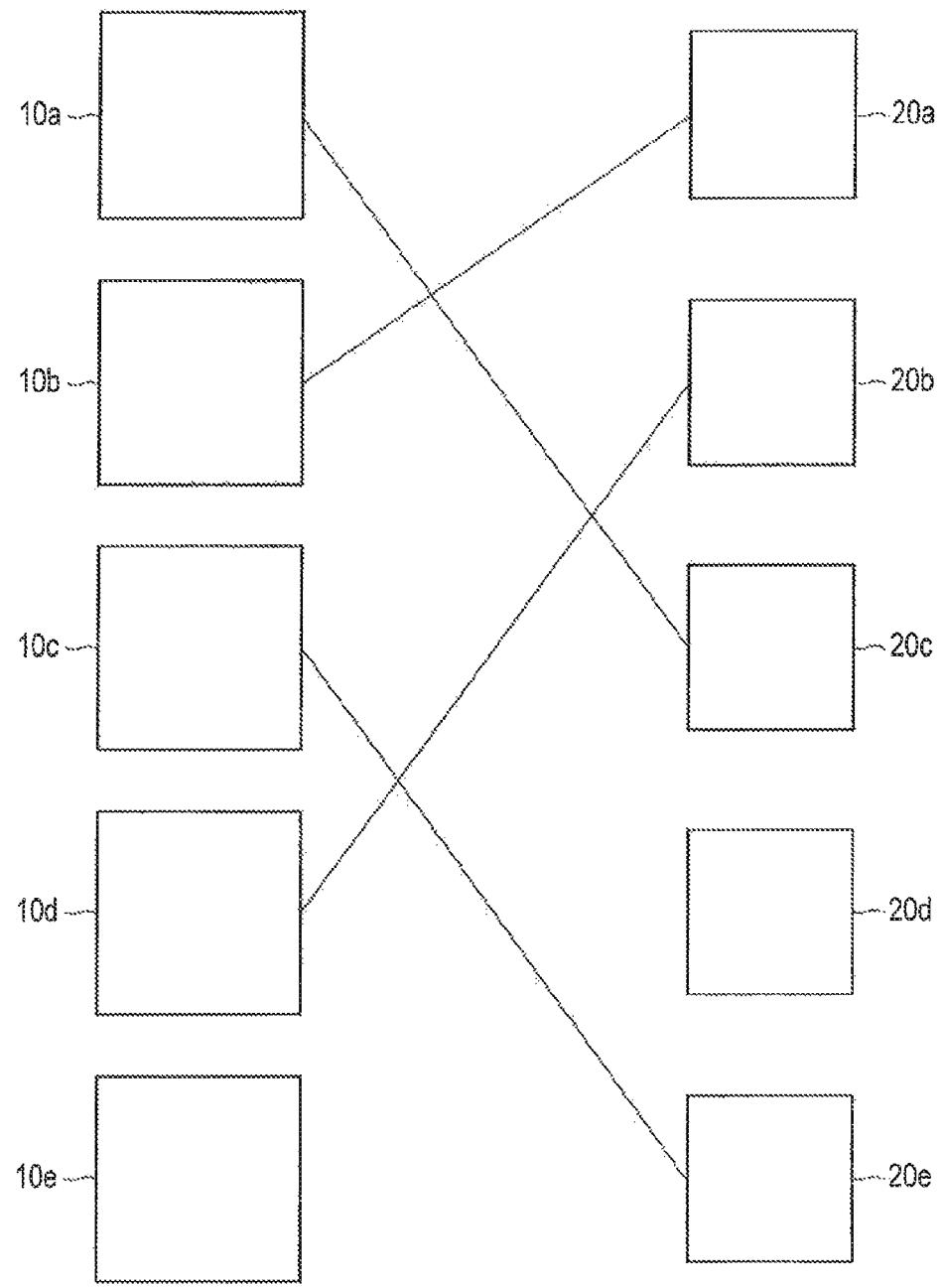
FIG. 4 is a diagram showing combinations of the mask substrate and the pellicle.

FIG. 4 is a diagram showing combinations of mask substrates and pellicles. The example in FIG. 4 shows combinations of five mask substrates 10a to 10e and five pellicles 20a to 20e. The number of mask substrates may differ from the number of pellicles. As seen in FIG. 4, a combination of a mask substrate 10a and a pellicle 20c makes the flatness of the mask substrate 10a smaller than the specified value. Similarly, the flatness of the mask substrate is smaller than the specified value in the cases of a combination of a mask substrate 10b and a pellicle 20a, a combination of a mask substrate 10c and a pellicle 20e, and a combination of a mask substrate 10d and a pellicle 20b. Furthermore, in the present example, a combination of a mask substrate 10e and a pellicle 20d prevents the flatness of the mask substrate 10e from being smaller than the specified value.

A first method for combining the mask substrate 10 with the pellicle 20 will be described. First, the method checks, by simulation, whether or not the flatness of a first mask substrate is smaller than the specified value if the first mask substrate is combined with a first pellicle. If the flatness is smaller than the specified value, the first mask substrate is determined to be combined with the first pellicle. If the flatness is not smaller than the specified value, the method checks, by simulation, whether or not the flatness of the first mask substrate is smaller than the specified value if the first mask substrate is combined with a second pellicle. In this manner, the first mask substrate is determined to be combined with any one of the pellicles. Then, a second mask substrate is determined to be combined with any one of the pellicles. At this time, the pellicles already determined to be combined with any of the mask substrates are excluded. For example, if the first mask substrate has already been determined to be combined with the first pellicle, the combination of the second mask substrate and the first pellicle is excluded. Similar operations are subsequently performed to sequentially determine combinations with the remaining mask substrates up to the final mask substrate.

A second method for combining the mask substrate 10 with the pellicle 20 will be described. First for the prepared mask substrates and pellicles, the second method determines combinations of the mask substrate and the pellicle so as to maximize the number of combinations. That is, combinations of the mask substrate and the pellicle are determined so as to maximize the number of combinations of the mask substrate and the pellicle which make the flatness of the mask substrate smaller than the specified value. Specifically, various existing algorithms are applicable.

The above-described step of determining combinations may be carried out on the mask substrate 10 with no pattern (circuit pattern) formed thereon or on the mask substrate 10 with a pattern (circuit pattern) formed thereon.

Figure 5:
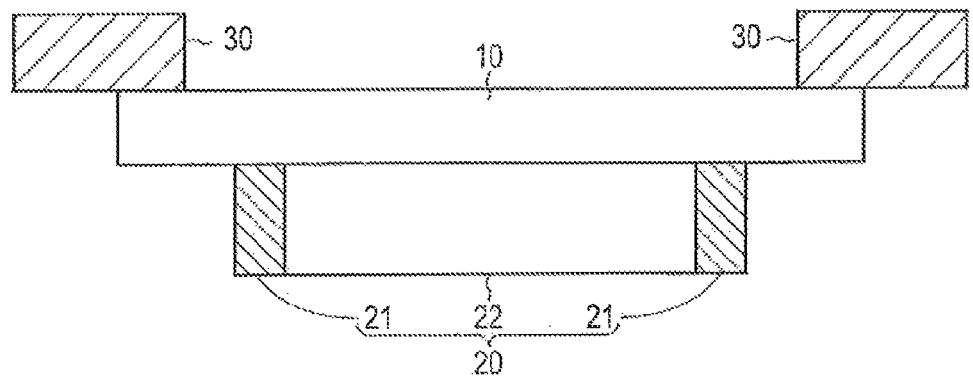
FIG. 5 is a cross-sectional view schematically showing that the mask substrate with the pellicle applied thereto is installed on a chuck.

Furthermore, if the lithography step is actually carried out, the mask substrate 10 with the pellicle 20 applied thereto is fixed to a chuck of an exposure apparatus. Thus, as shown in FIG. 5, combinations of the mask substrate 10 and the pellicle 20 may be determined so as to reduce the distortion of the mask substrate 10 when the mask substrate 10 with the pellicle 20 applied thereto is installed on a chuck 30.

Then, based on the combination determined in step S14, the pellicle 20 is applied to the mask substrate 10 (S15). Thus, a photo mask with the pellicle 20 applied thereto is manufactured.

As described above, according to the present embodiment, for a plurality of mask substrates and a plurality of pellicles prepared for one lithography process step, a combination of the mask substrate and the pellicle is determined based on the first data on the shapes of the mask substrates and the second data on the shapes of the pellicles. This allows such a combination of the mask substrate and the pellicle as meets a predetermined criterion (the flatness of the mask substrate is smaller than the specified value). This enables a reduction in the distortion of the photo mask with the pellicle applied thereto. As a result, pattern transfer can be carried out using a photo mask prevented from being significantly distorted and can be accurately achieved even with reduced size patterns. This also enables a reduction in the waste of mask substrates and thus in the total cost of the photo mask.

Furthermore, if a combination is determined before a pattern is formed on the mask substrate, the pellicle can be applied immediately after the formation of the pattern on the mask substrate. This allows the attachment of particles to the mask substrates to be minimized. Additionally, if a combination with a mask substrate with a pattern formed thereon is determined, the determination may be made with a change in the shape of the mask substrate (a change in flatness) as a result of patterning taken into account.

Figure 6:
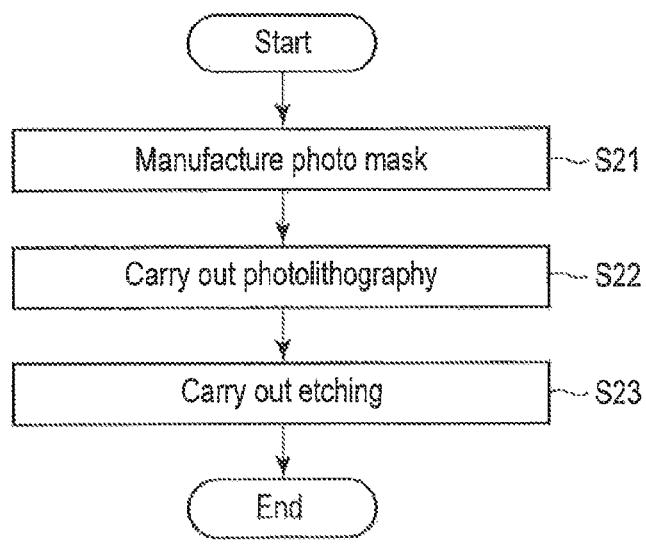
FIG. 6 is a flowchart showing a method for manufacturing a semiconductor device.

FIG. 6 is a flowchart showing a method for manufacturing a semiconductor device using the above-described method. First, a photo mask is manufactured using the above-described method (S21). Then, photolithography is carried out using the manufactured photo mask (S22). That is, the pattern (circuit pattern) formed on the photo mask is transferred to a photo resist on a semiconductor substrate to form a photo resist pattern. Moreover, the photo resist pattern is used to etch the semiconductor substrate or the film formed on the semiconductor substrate (S23).

Furthermore, the methods described above in the embodiment can be implemented by a computer the operation of which is controlled by a program with procedures for the methods described therein. The program can be provided via a recording medium such as a magnetic disk or a communication line such as the Internet (wired or wireless communication). Specifically, procedures based on desired steps of the methods described above in the embodiment or a combination of such desired steps can be described in the program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a photo mask, the method comprising:
   acquiring first data on respective first flatness of a plurality of mask substrates;
   acquiring second data on respective second flatness of a plurality of pellicles, the plurality of pellicles being isolated from the plurality of mask substrates;
   acquiring third data on respective third flatness of a plurality structures based on the first and the second data, wherein in each structure a selected pellicle among the plurality of pellicles is applied to a selected mask substrate among the plurality of mask substrates; and determining at least one combination of the mask substrate and the pellicle based on the third data such that the third flatness is smaller than a specified value.

2. The method according to claim 1, wherein the pellicle comprises a pellicle frame and a pellicle film, and
the second data relates to at least either respective flatness of the pellicle frames or flatness of pellicle films applied to the respective pellicle frames.

3. The method according to claim 1, wherein the acquiring the third data comprises acquiring the third data on respective third flatness of the plurality of structures in a state where each structure is fixed to a chuck of an exposure apparatus.

4. The method according to claim 1, wherein the determining the at least one combination comprises determining such a combination as to maximize a number of combinations of the mask substrate and the pellicle.

5. The method according to claim 1, wherein the determining the at least one combination is carried out before a pattern is formed on the mask substrate.

6. The method according to claim 1, wherein the determining the at least one combination is carried out on the mask substrate with a pattern formed thereon.

7. The method according to claim 1, wherein the acquiring the third data and the determining the at least one combination are carded out by simulation.

8. The method according to claim 1, wherein the mask substrate is a mask blank.

9. The method according to claim 1, wherein the mask substrate is a photo mask.

10. A method for manufacturing a semiconductor device, the method comprising transferring a pattern using a photo mask manufactured by the method according to claim 1.

11. The method according to claim 1, wherein the third data relates to flatness of the selected mask substrate in a corresponding structure.

12. A computer readable medium configured to store program instructions for manufacture of a photo mask, the program instructions causing a computer to perform:
acquiring first data on respective first flatness of a plurality of mask substrates;
acquiring second data on respective second flatness of a plurality of pellicles, the plurality of pellicles being isolated from the plurality of mask substrates;
acquiring third data on respective third flatness of a plurality structures based on the first and the second data, wherein in each structure a selected pellicle among the plurality of pellicles is applied to a selected mask substrate among the plurality of mask substrates; and
determining at least one combination of the mask substrate and the pellicle based on the third data such that the third flatness is smaller than a specified value.

* * * * *

UNITED STATES PATENT AND TRADEMARK OFFICE
CERTIFICATE OF CORRECTION

| | |
|---|---|
| PATENT NO. | : 8,883,373 B2 |
| APPLICATION NO. | : 13/679396 |
| DATED | : November 11, 2014 |
| INVENTOR(S) | : Mimotogi et al. |

It is certified that error appears in the above-identified patent and that said Letters Patent is hereby corrected as shown below:

In the Claims

Claim 1, column 4, lines 63-64, change "of a plurality structures" to --of a plurality of structures--.

Claim 7, column 5, line 24, change "are carded out by" to --are carried out by--.

Claim 12, column 6, lines 18-19, "of a plurality structures" to --of a plurality of structures--.

Signed and Sealed this
Seventh Day of April, 2015

Michelle K. Lee
*Director of the United States Patent and Trademark Office*